(12) United States Patent
Kamei et al.

(10) Patent No.: US 8,664,535 B2
(45) Date of Patent: Mar. 4, 2014

(54) WIRED CIRCUIT BOARD

(75) Inventors: Katsutoshi Kamei, Osaka (JP); Tetsuya Ohsawa, Osaka (JP); Voon Yee Ho, Osaka (JP)

(73) Assignee: Nitto Denko Corporation, Osaka (JP)

( * ) Notice: Subject to any disclaimer, the term of this patent is extended or adjusted under 35 U.S.C. 154(b) by 582 days.

(21) Appl. No.: 12/285,837

(22) Filed: Oct. 15, 2008

(65) Prior Publication Data

US 2009/0098745 A1    Apr. 16, 2009

Related U.S. Application Data

(60) Provisional application No. 60/960,981, filed on Oct. 24, 2007.

(30) Foreign Application Priority Data

Oct. 15, 2007    (JP) .................................. 2007-268292

(51) Int. Cl.
H05K 1/00    (2006.01)
H05K 1/03    (2006.01)

(52) U.S. Cl.
USPC ............ 174/254; 174/250; 174/251; 174/255

(58) Field of Classification Search
USPC ........... 174/250, 251, 254, 255; 360/317, 318
See application file for complete search history.

(56) References Cited

U.S. PATENT DOCUMENTS

| | | | | |
|---|---|---|---|---|
| 4,789,910 A * | 12/1988 | Otsuka et al. | ................. | 360/320 |
| 5,394,721 A * | 3/1995 | Iwayama et al. | ................. | 72/46 |
| 6,034,848 A * | 3/2000 | Garfunkel et al. | ....... | 360/125.68 |
| 6,791,794 B2 * | 9/2004 | Honjo et al. | ............. | 360/123.26 |
| 6,930,863 B2 * | 8/2005 | Biskeborn | ..................... | 360/319 |
| 7,092,215 B2 * | 8/2006 | Someya et al. | ............... | 360/246 |
| 7,325,296 B2 * | 2/2008 | Biskeborn | .................. | 29/603.14 |
| 7,701,674 B2 * | 4/2010 | Arai | .......................... | 360/245.9 |
| 7,723,617 B2 * | 5/2010 | Ishii et al. | ..................... | 174/254 |
| 7,986,495 B2 * | 7/2011 | Kamei et al. | ................... | 360/246 |
| 2002/0060090 A1 | 5/2002 | Ozeki et al. | | |
| 2003/0116343 A1 * | 6/2003 | Adachi et al. | .................. | 174/254 |
| 2004/0070884 A1 * | 4/2004 | Someya et al. | ............ | 360/245.9 |
| 2004/0190198 A1 * | 9/2004 | Honjo et al. | ................... | 360/126 |
| 2005/0186332 A1 * | 8/2005 | Funada et al. | ............... | 427/96.1 |
| 2007/0133128 A1 | 6/2007 | Arai | | |
| 2007/0197058 A1 | 8/2007 | Kitada et al. | | |
| 2009/0008137 A1 * | 1/2009 | Yokai et al. | .................... | 174/255 |
| 2009/0025217 A1 * | 1/2009 | Kamei | ............................ | 29/847 |
| 2009/0211787 A1 * | 8/2009 | Kamei et al. | ................. | 174/250 |
| 2010/0027229 A1 | 2/2010 | Kitada et al. | | |

FOREIGN PATENT DOCUMENTS

| | | |
|---|---|---|
| CN | 101026923 A | 8/2007 |
| JP | 08-264911 | 10/1996 |
| JP | 2002-111233 | 4/2002 |
| JP | 2004-133988 | 4/2004 |
| JP | 2004-207949 | 7/2004 |
| JP | 2007-164853 | 6/2007 |

* cited by examiner

*Primary Examiner* — Jayprakash N Gandhi
*Assistant Examiner* — Dion Ferguson
(74) *Attorney, Agent, or Firm* — Jean C. Edwards; Edwards Neils PLLC

(57) ABSTRACT

A wired circuit board includes a first insulating layer, a first wire formed on the first insulating layer, a second insulating layer formed on the first insulating layer so as to cover the first wire, and a second wire placed opposite to the first wire in a thickness direction and formed in a smaller width than that of the first wire.

6 Claims, 5 Drawing Sheets

WIRED CIRCUIT BOARD

CROSS-REFERENCE TO RELATED APPLICATIONS

This patent application claims the benefit of U.S. Provisional Application No. 60/960,981, filed on Oct. 24, 2007, and claims priority from Japanese Patent Application No. 2007-268292, filed on Oct. 15, 2007, the contents of which are herein incorporated by reference in their entirety.

BACKGROUND OF THE INVENTION

1. Field of the Invention

The present invention relates to a wired circuit board and, more particularly, to a wired circuit board such as a suspension board with circuit or a flexible wired circuit board.

2. Description of Related Art

A wired circuit board such as a suspension board with circuit or a flexible wired circuit board includes, e.g., an insulating base layer, a conductive layer formed on the insulating base layer and including a plurality of wires, and an insulating cover layer formed on the insulating base layer and covering the conductive layer.

For example, to stabilize the impedance of the conductive layer and suppress the occurrence of crosstalk, there has been proposed a wiring portion of a suspension for a disk which includes a second insulating layer (second layer), a second conductor for writing and a second conductor for reading placed thereon in widthwise spaced-apart relation, a first insulating layer (first layer) covering these conductors, and a first conductor for writing and a first conductor for reading placed thereon in widthwise spaced-apart relation (see, e.g., Japanese Unexamined Patent No. 2004-133988 (FIG. 9)). In the wiring portion, the second conductor for writing and the first conductor for reading are placed in the same width and opposite to each other in a thickness direction, and the second conductor for reading and the first conductor for writing are placed in the same width and opposite to each other in the thickness direction.

SUMMARY OF THE INVENTION

To form the wiring portion proposed in Japanese Unexamined Patent No. 2004-133988, after the second conductor for writing and the second conductor for reading are formed, the first insulating layer is formed to cover these conductors. As a result, large stepped portions corresponding to the second conductor for writing and the second conductor for reading are formed in the first insulating layer covering the both widthwise end portions of the second conductor for writing and the second conductor for reading.

When each of the first conductor for writing and the first conductor for reading is formed on the first insulating layer formed with such stepped portions to have the same width as that of each of the second conductor for reading and the second conductor for writing, displacement of the first conductor for writing and the first conductor for reading may occur due to the stepped portions to degrade the accuracy of placement. As a result, there is a problem that impedance in the wiring portion becomes unstable.

An object of the present invention is to provide a wired circuit board which is excellent in the accuracy of placement of the second wire and allows stabilization of impedance in a first wire and a second wire.

A wired circuit board according to the present invention comprises a first insulating layer, a first wire formed on the first insulating layer, a second insulating layer formed on the first insulating layer so as to cover the first wire, and a second wire placed opposite to the first wire in a thickness direction and formed in a smaller width than that of the first wire.

In the wired circuit board according to the present invention, it is preferable that the first wire and the second wire are each provided corresponding to a read wire and a write wire.

In the wired circuit board according to the present invention, even when a stepped portion is formed in the second insulating layer covering the first wire, since the width of the second wire is smaller than that of the first wire, the second wire is formed on a flat portion of the second insulating layer inside the stepped portion. This allows an improvement in the accuracy of placement of the second wire. As a result, it is possible to reliably stabilize the impedance of each of the first wire and the second wire.

DETAILED DESCRIPTION OF PREFERRED EMBODIMENTS

Figure 1:
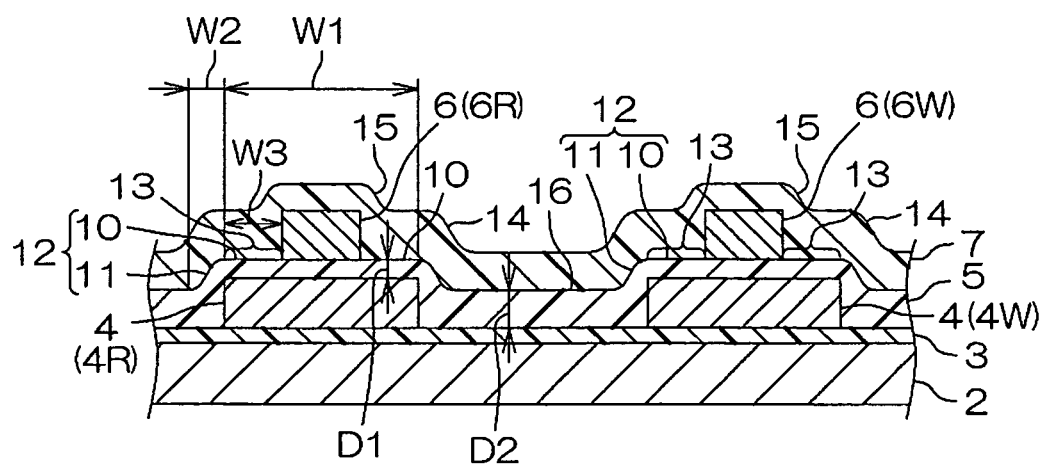
FIG. 1 is a principal-portion cross-sectional view showing an embodiment (implementation as a suspension board with circuit) of a wired circuit board according to the present invention.
Figure 2:
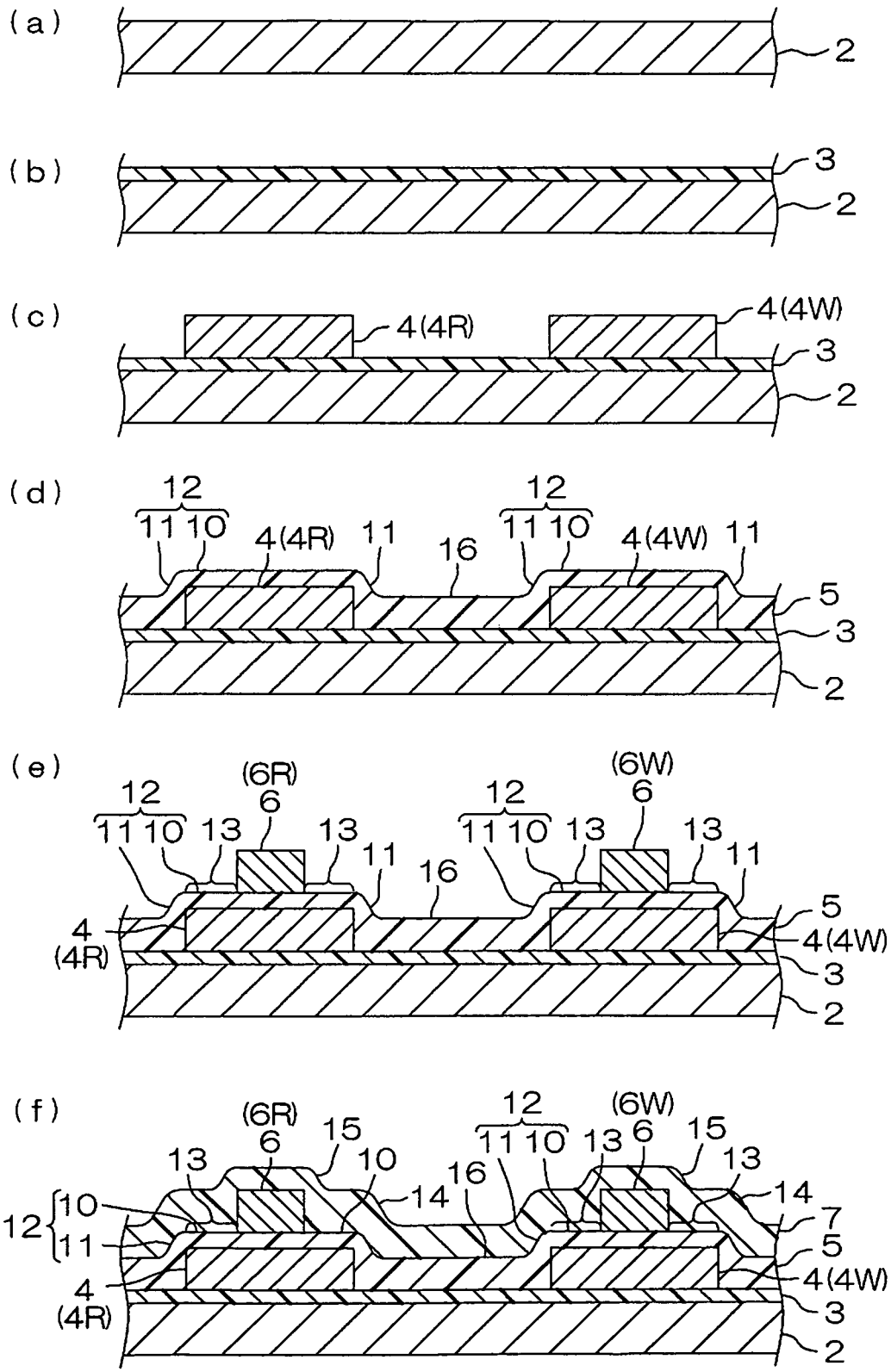
FIG. 2 is a process cross-sectional view showing a method for producing the wired circuit board shown in FIG. 1, (a) showing the step of preparing a metal supporting board, (b) showing the step of forming an insulating base layer on the metal supporting board, (c) showing the step of forming first wires on the insulating base layer, (d) showing the step of forming an intermediate insulating layer on the insulating base layer, (e) showing the step of forming second wires on the intermediate insulating layer, and (f) showing the step of forming an insulating cover layer on the intermediate insulating layer.

FIG. 1 is a principal-portion cross-sectional view showing an embodiment of a wired circuit board according to the present invention. FIG. 2 is a process cross-sectional view showing a method for producing the wired circuit board shown in FIG. 1.

In FIG. 1, the wired circuit board 1 is a suspension board with circuit mounted on a hard disk drive and includes a metal supporting board 2 extending in a longitudinal direction and an insulating base layer 3 as a first insulating layer formed on the metal supporting board 2. The wired circuit board 1 also includes first wires 4 formed on the insulating base layer 3, an intermediate insulating layer 5 as a second insulating layer formed on the insulating base layer 3 so as to cover the first wires 4, second wires 6 formed on the intermediate insulating layer 5, and an insulating cover layer 7 formed on the intermediate insulating layer 5 so as to cover the second wires 6.

The metal supporting board is made of a metal foil in the shape of a flat plate or a metal thin plate. The thickness of the metal supporting board 2 is in the range of, e.g., 10 to 30 μm, or preferably 15 to 25 μm.

The insulating base layer 3 is formed on the surface of the metal supporting board 2. More specifically, the insulating base layer 3 is formed on the entire upper surface of the metal supporting board 2 in a widthwise direction (direction perpendicular to the longitudinal direction). The thickness of the insulating base layer 3 is in the range of, e.g., 1 to 10 μm, or preferably 1 to 5 μm.

The plurality of (e.g., two) first wires 4 are formed on the surface of the insulating base layer 3 in a parallel arrangement along the longitudinal direction. Each of the first wires 4 is formed in a generally rectangular shape when viewed in cross section. At the both longitudinal end portions of each of the first wires 4, first terminal portions not shown are provided. The first wires 4 and the first terminal portions are formed continuously as a wired circuit pattern.

The individual first wires 4 are provided corresponding to a read wire and a write wire together with the second wires 6 described later. More specifically, the first wires 4 include a first read wire 4R and a first write wire 4W. The first read wire 4R is placed on one widthwise side (left side in FIG. 1), and the first write wire 4W is placed on the other widthwise side (right side in FIG. 1) to be spaced apart from the first read wire 4R.

The thickness of the first wire 4 is in the range of, e.g., 1 to 50 μm, or preferably 5 to 15 μm. The width (widthwise length) of each of the first wires 4 is in the range of, e.g., 15 to 210 μm, or preferably 20 to 50 μm. The spacing (widthwise spacing between the first read wire 4R and the first write wire 4W) between the individual first wires 4 is in the range of, e.g., 10 to 200 μm, or preferably 15 to 50 μm.

The intermediate insulating layer 5 covers the surfaces of the first wires 4 and the insulating base layer 3. More specifically, the intermediate insulating layer 5 is formed on the entire upper surface of the insulating base layer 3 including the first wires 4 in the widthwise direction. Of the intermediate insulating layer 5, the portions (protruding portions) 12 covering the upper surfaces and side surfaces of the first wires 4 protrude upward in the thickness direction relative to a base-side flat portion 16 covering the surface of the insulating base layer 3 (the widthwise middle portion between the individual first wires 4 except for the both end portions) exposed from the first wires 4. Of the protruding portions 12, the portions formed on the upper sides (except for the both widthwise sides) of the respective individual first wires 4 are designated as wire-side flat portions 10 and the portions formed on both widthwise sides (more specifically, obliquely above the both widthwise sides) of the individual first wires 4 are designated as first stepped portions (shoulder portions) 11. The individual first stepped portions 11 are formed such that the respective upper surfaces (top surfaces) thereof are curved downward from the both widthwise end portions of the wire-side flat portions 10 and then reach the both widthwise end portions of the base-side flat portion 16 to correspond to the corner portions of the first wires 4 (both widthwise end edges of the upper surfaces of the first wires 4). The intermediate insulating layer 5 is opened to expose the first terminal portions not shown.

The thickness of the intermediate insulating layer 5 is such that the thickness (the distance between the upper surface of the base-side flat portion 16 and the upper surface of the insulating base layer 3) D2 of the base-side flat portion 16 is in the range of, e.g., 1 to 15 μm, or preferably 3 to 10 μm, and the thickness (the distance between the upper surface of the wire-side flat portion 10 and the upper surface of the first wire 4) D1 of the wire-side flat portion 10 is in the range of, e.g., 1 to 15 μm, or preferably 3 to 7 μm.

The width W1 of the wire-side flat portion 10 is in the range of, e.g., 10 to 195 μm, or preferably 15 to 50 μm. The width W2 of the first stepped portion 11 is, e.g., not more than 10 μm, or preferably not more than 2 μm.

The second wires 6 are formed on the surface of the intermediate insulating layer 5. The plurality of (e.g., two) second wires 6 are provided in a parallel arrangement along the longitudinal direction. That is, the second wires 6 are placed above and opposite to the first wires 4 in the thickness direction and formed on the upper surfaces of the wire-side flat portions 10 of the intermediate insulating layer 5. More specifically, the individual second wires 6 are formed on the upper surfaces of the widthwise middle portions of the wire-side flat portions 10. That is, the individual second wires 6 are formed such that margin portions 13 formed without the second wires 6 are provided at the both widthwise end portions of the upper surfaces of the wire-side flat portions 10. Each of the second wires 6 is formed in a generally rectangular shape when viewed in cross section. The both longitudinal end portions of the individual second wires 6 are provided with second terminal portions not shown. The second wires 6 and the second terminal portions are formed continuously as the wired circuit pattern.

The individual second wires 6 are provided corresponding to a read wire and a write wire together with the individual first wires 4. More specifically, the second wires 6 include a second read wire 6R and a second write wire 6W. The second read wire 6R is placed on one widthwise side (left side in FIG. 1), and the second write wire 6W is placed on the other widthwise side (right side in FIG. 1) to be spaced apart from the second read wire 6R.

As a result, the second read wire 6R is placed above and opposite to the first read wire 4R in the thickness direction, and the second write wire 6W is placed above and opposite to the first write wire 6W in the thickness direction.

The thickness of the second wire 6 is in the range of, e.g., 1 to 50 μm, or preferably 5 to 15 μm.

Each of the second wires 6 is formed in a width smaller than that of each of the first wires 4 by, e.g., 5 to 100 μm, or preferably by 10 to 30 μm. The width of the second wire 6 is in the range of, e.g., 5 to 200 μm, or preferably 10 to 50 μm.

The spacing between of the individual second wires 6 is in the range of, e.g., 15 to 250 μm, or preferably 20 to 80 μm.

The width (widthwise length) W3 of each of the margin portions 13 of the wire-side flat portions 10 is in the range of, e.g., 5 to 200 μm, or preferably 10 to 50 μm.

The insulating cover layer 7 covers the surfaces of the second wires 6 and the intermediate insulating layer 5. More specifically, the insulating cover layer 7 is formed on the entire upper surface of the intermediate insulating layer 5 including the second wires 6 in the widthwise direction. The insulating cover layer 7 is formed in a flat shape on the base-side flat portion 16 of the intermediate insulating layer 5, and the portions protruding upward in the thickness direction are formed as second stepped portions 14 and third stepped portions 15 to correspond to the first stepped portions 11 of the intermediate insulating layer 5 and to the second wires 6. The upper surfaces of the second stepped portions 14 and the third stepped portions 15 are formed in generally the same shape as the upper surfaces of the first stepped portions 11. The insulating cover layer 7 is opened to expose the second terminal portions not shown.

The thickness of the insulating cover layer 7 (the thickness of the flat portion) is in the range of, e.g., 2 to 10 μm, or preferably 3 to 6 μm.

Next, a description will be given to a method for producing the wired circuit board 1 with reference to FIG. 2.

First, as shown in FIG. 2(a), the metal supporting board 2 is prepared in the method. Examples of a metal material used to form the metal supporting board 2 include stainless steel and 42-alloy. Preferably, SUS304 based on a standard for stainless steel (e.g., AISI (American Iron and Steel Institute)) or the like is used.

Next, in the method, as shown in FIG. 2(b), the insulating base layer 3 is formed on the metal supporting board 2.

Examples of an insulating material used to form the insulating base layer 3 include synthetic resins such as, e.g., polyimide, polyether nitrile, polyether sulfone, polyethylene terephthalate, polyethylene naphthalate, and polyvinyl chloride. Among them, a photosensitive synthetic resin is preferably used, or more preferably, photosensitive polyimide is used.

To form the insulating base layer 3, e.g., a solution (varnish) of any of the synthetic resins mentioned above is uniformly coated on the entire upper surface of the metal supporting board 2, dried, and then heated as necessary to be cured.

Alternatively, the insulating base layer 3 can also be formed as a pattern by a method in which a photosensitive synthetic resin is coated, dried, exposed to light, developed, and cured as necessary. The formation of the insulating base layer 3 is not limited to the methods described above. For example, it is also possible to preliminarily form a synthetic resin into a film and sticking the film to the surface of the metal supporting board 2 via a known adhesive layer.

Then, in this method, as shown in FIG. 2(c), the first wires 4 and the first terminal portions not shown are formed in the foregoing pattern on the insulating base layer 3.

Examples of materials used to form the first wires 4 and the first terminal portions not shown include metal materials such as, e.g., copper, nickel, gold, a solder, and alloys thereof. Among them, copper is preferably used.

To form the first wires 4 and the first terminal portions, a known patterning method such as, e.g., an additive method or a subtractive method is used. Preferably, the additive method is used.

In the additive method, a first metal thin film (seed film) not shown is first formed on the entire upper surface of the insulating base layer 3. For the first metal thin film, a metal material is used such as copper, chromium, nickel, or an alloy thereof. The first metal thin film is formed by a thin-film formation method such as sputtering or plating. Preferably, the first metal thin film is formed by sputtering.

Next, a dry film resist is provided on the surface of the first metal thin film, exposed to light, and developed to form a plating resist, which is not shown, in a pattern reverse to the pattern of the first wires 4 and the first terminal portions. Then, the first wires 4 and the first terminal portions are formed as the wired circuit pattern by plating on the surface of the first metal thin film exposed from the plating resist. Then, the plating resist and the first metal thin film on the portion where the plating resist is formed are removed by etching or the like.

Next, in the method, as shown in FIG. 2(d), the intermediate insulating layer 5 is formed on the insulating base layer 3 so as to cover the first wires 4.

As an insulating material for forming the intermediate insulating layer 4, the same insulating material is used that is used to form the insulating base layer 3 mentioned above.

To form the intermediate insulating layer 5, e.g., a solution (varnish) of any of the synthetic resins mentioned above is uniformly coated on the entire upper surface of the insulating base layer 3 including the first wires 4, thereafter dried, and then heated as necessary to be cured.

Alternatively, the intermediate insulating layer 5 can also be formed as a pattern by a method in which a photosensitive synthetic resin is coated, dried, exposed to light, developed, and cured as necessary. The formation of the intermediate insulating layer 5 is not limited to the methods described above. For example, it is also possible to preliminarily form a synthetic resin into a film and stick the film to the surface of the insulating base layer 3 including the first wires 4 via a known adhesive layer.

Next, in the method, as shown in FIG. 2(e), the second wires 6 and the second terminal portions not shown are formed in the foregoing pattern on the intermediate insulating layer 5.

As a material for forming the second wires 6 and the second terminal portions, the same material as used to form the first wires 4 and the first terminal portions mentioned above is used.

To form the second wires 6 and the second terminal portions, the same patterning method as mentioned above is used. Preferably, the additive method is used.

In the additive method, a second metal thin film (seed film) not shown is first formed on the entire upper surface of the intermediate insulating layer 5. For the second metal thin film, the same metal material is used that is mentioned above. The second metal thin film is formed by the same thin-film formation method as described above. Preferably, the second metal thin film is formed by sputtering.

Next, a dry film resist is provided on the surface of the second metal thin film, exposed to light, and developed to form a plating resist, which is not shown, in a pattern reverse to the pattern of the second wires 6 and the second terminal portions. Then, the second wires 6 and the second terminal portions are formed as the wired circuit pattern by plating on the surface of the second metal thin film exposed from the plating resist. Then, the plating resist and the second metal thin film on the portion where the plating resist is formed are removed by etching or the like.

In this manner, the second wires 6 are placed opposite to the first wires 4 in the thickness direction to be formed in a width smaller than that of the first wires.

Next, in the method, as shown in FIG. 2(f), the insulating cover layer 7 is formed on the intermediate insulating layer 5 so as to cover the second wires 6.

As an insulating material for forming the insulating cover layer 7, the same insulating material is used that is used to form the insulating base layer 3.

To form the insulating cover layer 7, e.g., a solution (varnish) of any of the synthetic resins mentioned above is uniformly coated on the entire upper surface of the intermediate insulating layer 5 including the second wires 6, thereafter dried, and then heated as necessary to be cured.

Alternatively, the insulating cover layer 7 can also be formed as a pattern by a method in which a photosensitive synthetic resin is coated, dried, exposed to light, and developed as necessary to be cured. The formation of the insulating cover layer 7 is not limited to the methods described above. For example, it is also possible to preliminarily form a synthetic resin into a film and stick the film to the surface of the intermediate insulating layer 5 including the second wires 6 via a known adhesive layer.

Thereafter, the metal supporting board 2 is trimmed into a desired shape as necessary, whereby the wired circuit board 1 is obtained.

In the wired circuit board 1, even when the first stepped portions 11 are produced in the intermediate insulating layer 5 covering the first wires 4, since the width of each of the second wires 6 is smaller than that of each of the first wires 4, the second wires 6 are formed on the upper surfaces of the wire-side flat portions 10 inside the first stepped portions 11 in the intermediate insulating layer 5. This allows an improvement in the accuracy of placement of the second wires 6. As a result, it is possible to reliably stabilize the impedance of the first wires 4 and the second wires 6.

The first wires 4 and the second wires 6 are provided as the read wires and the write wires, i.e., the first read wire 4R, the second read wire 6R, the first write wire 4W, and the second write wire 6W. Since the first read wire 4R and the second read wire 6R are placed opposite to each other in the thickness direction, the impedance of read signals inputted thereto can be stabilized. Moreover, since the first write wire 4W and the second write wire 6W are placed opposite to each other in the thickness direction, the impedances of write signals inputted thereto can be stabilized.

Figure 5:
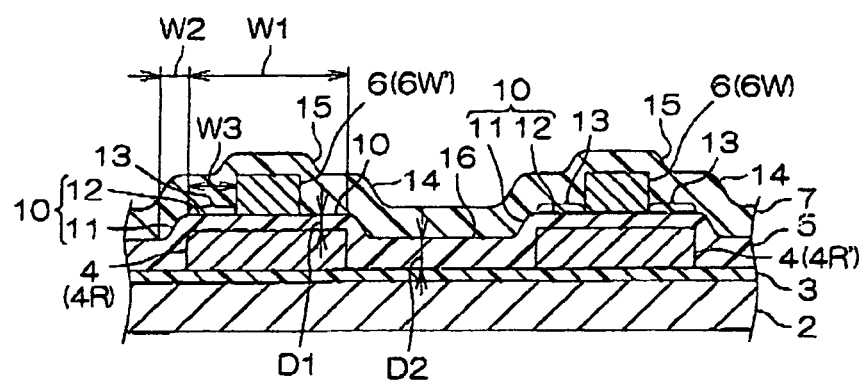
FIG. 5 is similar to FIG. 1 but shows a second embodiment of a wired circuit board according to the present invention.
Figure 6:
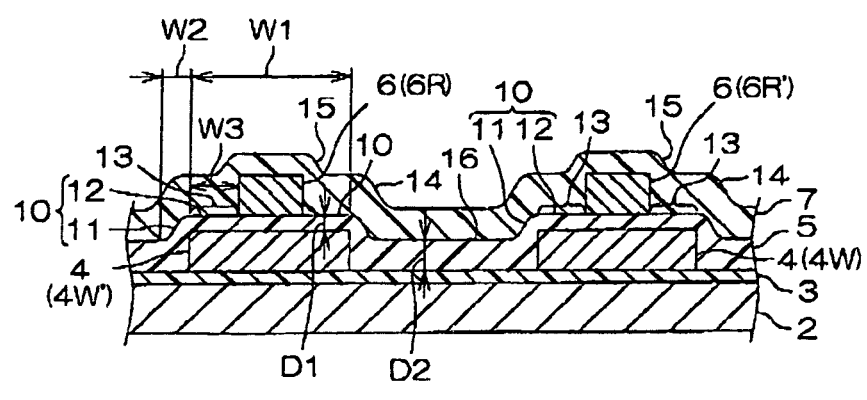
FIG. 6 is similar to FIG. 1 but shows a third embodiment of a wired circuit board according to the present invention.

In the description given above, the first wires 4 are formed of the first read wire 4R and the first write wire 4W, and the second wires 6 are formed of the second read wire 6R and the second write wire 6W, but not limited thereto. It is possible to form the first wires 4 only of read wires (a first read wire 4R and a second read wire 4R'—see FIG. 5) and form the second wires 6 only of write wires (a first write wire 4W and a second write wire 4W'—see FIG. 6). Alternatively, it is also possible to form the first wires 4 only of write wires and form the second wires 6 only of read wires.

Figure 3:
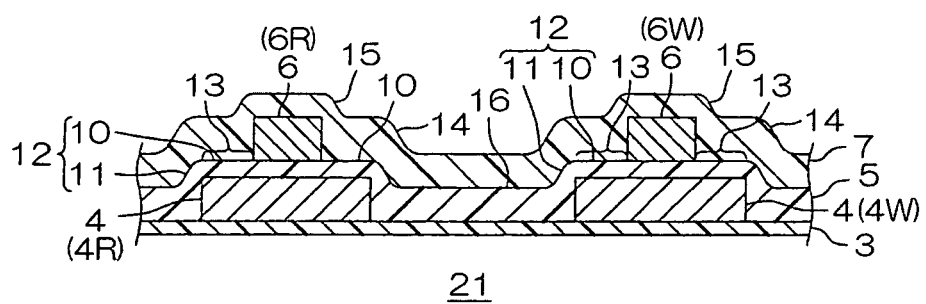
FIG. 3 is a principal-portion cross-sectional view showing another embodiment (implementation as a flexible wired circuit board) of the wired circuit board according to the present invention.

In the description given above, the wired circuit board according to the present invention has been described by way of example as the suspension board with circuit including the metal supporting board 2. However, the wired circuit board according to the present invention is not limited thereto. For example, it is also possible to form the wired circuit board according to the present invention as a flexible wired circuit board 21 not including the metal supporting board 2 (see FIG. 3).

EXAMPLES

The present invention is described more specifically by showing an example and a comparative example hereinbelow. However, the present invention is by no means limited to the example and the comparative example.

Example 1

First, a metal supporting board made of a stainless steel foil (SUS304) having a thickness of 25 μm was prepared (see FIG. 2(a)). Then, a varnish of a photosensitive polyamic acid resin was coated on the entire upper surface of the metal supporting board, dried, exposed to light after drying, developed, and further cured by heating to form an insulating base layer made of polyimide having a thickness of 10 μm (see FIG. 2(b)).

Subsequently, first wires and first terminal portions were formed by an additive method on the insulating base layer.

In the additive method, a chromium thin film having a thickness of 0.03 μm and a copper thin film having a thickness of 0.07 μm were successively formed, each as a first metal thin film, by chromium sputtering and copper sputtering on the entire upper surface of the insulating base layer. Then, a plating resist in a pattern reverse to the pattern of the first wires and the first terminal portions was formed on the surface of the first metal thin film. Then, the first wires and the first terminal portions each having a thickness of 10 μm were formed by electrolytic copper plating on the surface of the first metal thin film exposed from the plating resist. Then the plating resist and the first metal thin film on the portion where the plating resist was formed were removed by chemical etching (see FIG. 2(c)).

The width of each of the first wires was 50 μm and the spacing between the individual first wires was 25 μm.

Then, a varnish of a photosensitive polyamic acid resin solution was coated on the entire upper surface of the insulating base layer including the first wires, dried, exposed to light after drying, developed, and further cured by heating to form an intermediate insulating layer made of polyimide (see FIG. 2(d)).

In the intermediate insulating layer, there were formed a base-side flat portion and protruding portions including wire-side flat portions and first stepped portions. The thickness of the wire-side flat portion was 5 μm. The width of the wire-side flat portion was 48 μm, and the width of the first stepped portion was 22 μm.

Then, second wires and second terminal portions were formed by an additive method on the intermediate insulating layer.

In the additive method, a chromium thin film having a thickness of 0.03 μm and a copper thin film having a thickness of 0.07 μm were successively formed, each as a second metal thin film, by chromium sputtering and copper sputtering on the entire upper surface of the intermediate insulating layer. Then, a plating resist in a pattern reverse to the pattern of the second wires and the second terminal portions was formed on the surface of the second metal thin film. Then, the second wires and the second terminal portions each having a thickness of 10 μm were formed by electrolytic copper plating on the surface of the second metal thin film exposed from the plating resist. Then the plating resist and the second metal thin film on the portion where the plating resist was formed were removed by chemical etching (see FIG. 2(e)).

The individual second wires were placed opposite to the respective first wires in the thickness direction and formed on the widthwise middle portions of the upper surfaces of the wire-side flat portions. The width of each of the second wires was smaller than that of each of the first wires by 25 μm, i.e., was 25 μm. The spacing between the individual second wires was 50 μm. The width of the margin portion of the wire-side flat portion was 23 μm.

Then, a varnish of a photosensitive polyamic acid resin was coated on the entire upper surface of the intermediate insulating layer including the second wires, exposed to light after drying, developed, and further cured by heating to form an insulating cover layer made of polyimide having a thickness (thickness of the flat portion) of 5 μm (see FIG. 1 and FIG. 2(f)). Thereafter, the metal, supporting board was cut out into a desired shape by etching, whereby a suspension board with circuit was obtained.

Comparative Example 1

Figure 4:
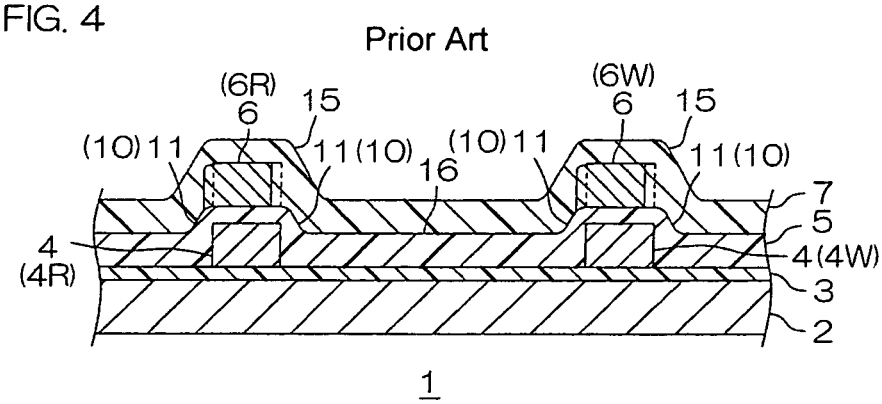
FIG. 4 is a principal-portion cross-sectional view showing a suspension board with circuit according to Comparative Example 1.

A suspension board with circuit was obtained by performing the same process as in Example 1 except that the width of the first wire was changed to 25 μm (i.e., the same as the width of the second wire) in the formation of the first wire (see FIG. 4).

The spacing between the first wires was 25 μm and the width of the wire-side flat portion of the intermediate insulating layer was 20 μm.

(Evaluation)
(1) SEM Observation

Each of the suspension boards with circuit of Example 1 and Comparative Example 1 was cut by a mechanical polishing method along the width direction, and the section (widthwise cross section) thereof was observed with a SEM (electron microscope).

As a result, Example 1 confirmed that the displacement of the second wires was not produced and the second wires were included in the first wires when viewed in plan view.

By contrast, as shown in FIG. 4, Comparative Example 1 confirmed that the displacement of the second wires (i.e., shifts from intended formation positions (imaginary lines) to actual formation positions (solid lines)) was produced and the one widthwise terminal portions of the second wires were not included in the first wires when viewed in plan view.

(2) Characteristic Impedance

In each of the suspension boards with circuit of Example 1 and Comparative Example 1, the range of the characteristic impedance of each of the first wires and the second wires was measured by TDR (Time Domain Reflectometry).

As a result, the range of the characteristic impedance of Example 1 was 5Ω, while the range of the characteristic impedance of Comparative Example 1 was 15 Ω.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a first insulating layer;
   a plurality of first wires formed on the first insulating layer, the plurality of first wires being composed of copper, each of the plurality of first wires having a length, a width, and a thickness, and the plurality of first wires comprising at least one of a read wire or a write wire;
   a second insulating layer formed on the first insulating layer so as to cover at least a portion of the plurality of first wires; and
   a plurality of second wires formed directly on a surface of the second insulating layer which faces opposite to a surface of the second insulating layer which contacts the plurality of first wires, each of the plurality of second wires having a length, a width, and a thickness, at least a portion of each of the plurality of second wires being positioned directly above at least a portion of a corresponding one of the plurality of first wires in a thickness direction, the plurality of second wires being composed of copper, each of the plurality of second wires being formed in a smaller width than that of each of the plurality of first wires, and the plurality of second wires comprising at least one of a read wire or a write wire,
   wherein the second insulating layer includes a base-side flat portion formed on the first insulating layer at a position located between adjacent ones of the plurality of first wires, a protruding portion protruding upwardly in the thickness direction relative to the base-side flat portion and covering an upper surface and side surfaces of each of the plurality of first wires,
   wherein the protruding portion includes first stepped shoulder portions formed on both widthwise sides of each of the plurality of first wires, and a wire-side flat portion formed on the upper surface of each of the plurality of first wires, with each of the first stepped shoulder portions being formed such that an upper surface thereof is curved downward from a corresponding end portion of the wire-side flat portion until reaching the base-side flat portion,
   wherein a corresponding one of the plurality of second wires is formed on the wire-side flat portion that is formed on the upper surface of each of the plurality of first wires,
   wherein margin portions are provided at both widthwise end portions of an upper surface of the wire-side flat portion, which surface is devoid of the second wires,
   wherein a width of each of the margin portions is in a range of 5 μm to 50 μm,
   wherein a width of each of the second wires is in a range of 10 μm to 50 μm, and
   wherein the read wire is configured to carry a read signal and the write wire is configured to carry a write signal.

2. The wired circuit board according to claim 1, wherein the plurality of first wires comprise a first read wire and a first write wire, and the plurality of second wires comprise a second read wire and a second write wire.

3. The wired circuit board according to claim 1, wherein the plurality of first wires comprise a first read wire and a second read wire, and the plurality of second wires comprise a first write wire and a second write wire.

4. The wired circuit board according to claim 1, wherein the plurality of first wires comprise a first write wire and a second write wire, and the plurality of second wires comprise a first read wire and a second read wire.

5. The wired circuit board according to claim 1, wherein a distance between an upper surface of the base-side flat portion and an upper surface of the first insulating layer is greater than a distance between an upper surface of the wire-side flat portion of the protruding portion of the second insulating layer and the upper surface of each of the plurality of first wires.

6. The wired circuit board according to claim 1, wherein a width of each of the margin portions is in a range of 10 μm to 50 μm.

* * * * *